(12) United States Patent
Baars et al.

(10) Patent No.: US 7,566,611 B2
(45) Date of Patent: Jul. 28, 2009

(54) MANUFACTURING METHOD FOR AN INTEGRATED SEMICONDUCTOR STRUCTURE

(75) Inventors: Peter Baars, Dresden (DE); Klaus Muemmler, Dresden (DE); Stefan Tegen, Dresden (DE); Daniel Koehler, Chemnitz (DE); Joern Regul, Dresden (DE)

(73) Assignee: Qimonda AG, Munich (DE)

(*) Notice: Subject to any disclaimer, the term of this patent is extended or adjusted under 35 U.S.C. 154(b) by 568 days.

(21) Appl. No.: 11/443,652

(22) Filed: May 31, 2006

(65) Prior Publication Data
US 2007/0281417 A1  Dec. 6, 2007

(51) Int. Cl.
*H01L 21/8234* (2006.01)
(52) U.S. Cl. .................. 438/238; 438/210; 438/253; 438/254; 438/255; 438/256; 438/381; 438/393; 438/394; 438/395; 438/396; 257/E21.641
(58) Field of Classification Search .......... 438/210, 438/256, 394, 395
See application file for complete search history.

(56) References Cited
U.S. PATENT DOCUMENTS
6,506,647 B2 *  1/2003  Kuroda et al. .............. 438/275
6,784,066 B2    8/2004  Hachisuka

FOREIGN PATENT DOCUMENTS
DE    10314274    9/2004

OTHER PUBLICATIONS
German Examination Report dated Jan. 18, 2007.
* cited by examiner

*Primary Examiner*—Michael S. Lebentritt
*Assistant Examiner*—Kyoung Lee
(74) *Attorney, Agent, or Firm*—Jenkins, Wilson, Taylor & Hunt, P.A.

(57) ABSTRACT

The present invention provides a manufacturing method for an integrated semiconductor structure comprising the steps of providing a semiconductor substrate having a plurality of gate stacks in a memory cell region and at least one gate stack in a peripheral device region; forming caps made of one or more layers of a cap material over said plurality of gate stacks in said memory cell region and over said at least one gate stack in said peripheral device region; depositing a first protective layer made of carbon or made of a carbon containing material over said memory cell region and peripheral device region; forming a mask layer on said first protective layer in said memory cell region; exposing said cap of said at least one gate stack in said peripheral device region by removing said first protective layer in said peripheral device region in an etch step wherein said mask layer acts as a mask in said memory cell region; removing said mask layer and said first protective layer from said memory cell region; forming a first contact hole between two neighboring gate stacks in said memory cell region, said first contact hole exposing a contact area; forming at least one other contact hole in said peripheral device region, said at least one other contact hole exposing another contact area which is located either adjacent to said gate stack or in said gate stack in said peripheral device region; and filling said contact hole and said at least one other contact hole with a respective contact plug.

17 Claims, 16 Drawing Sheets

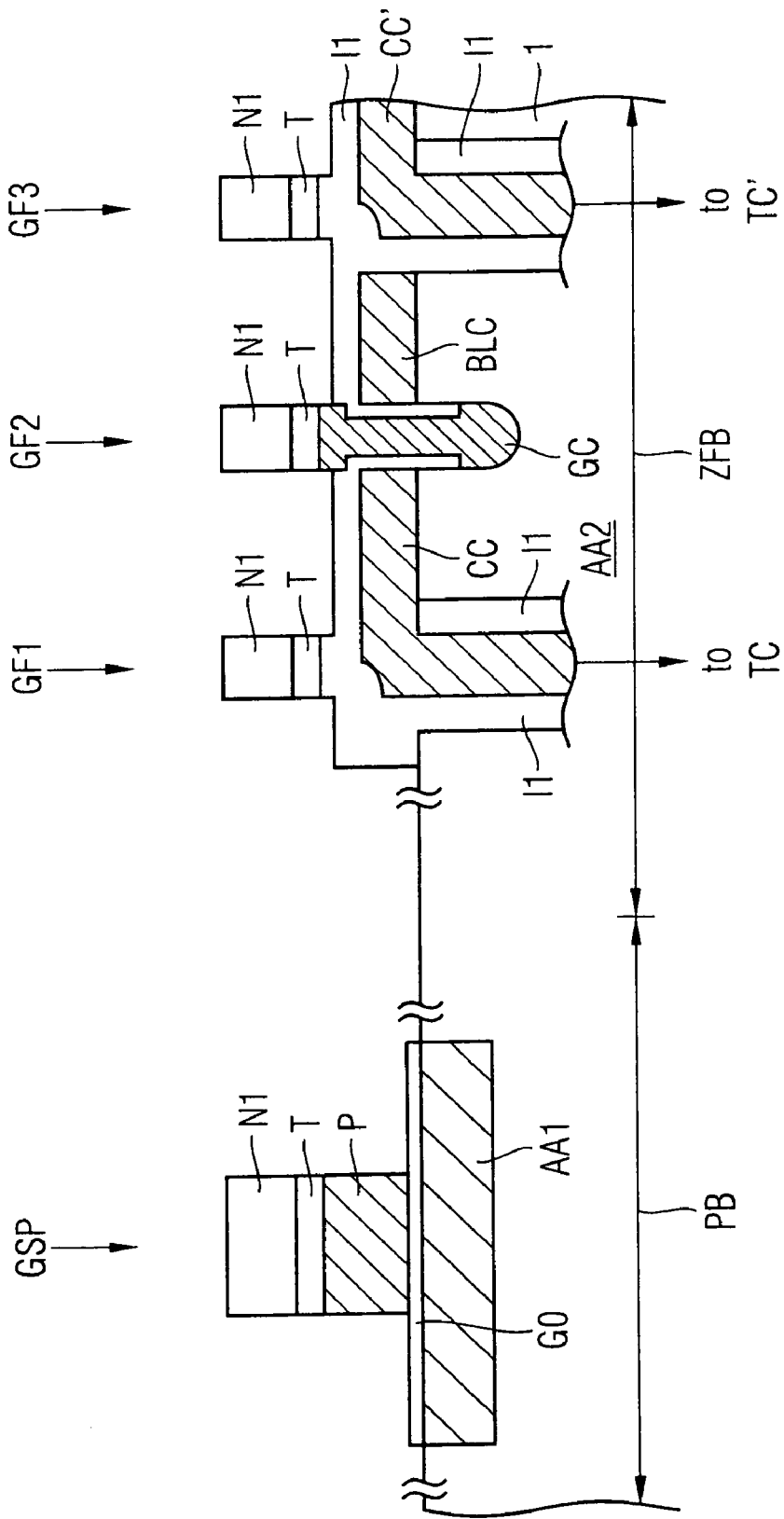

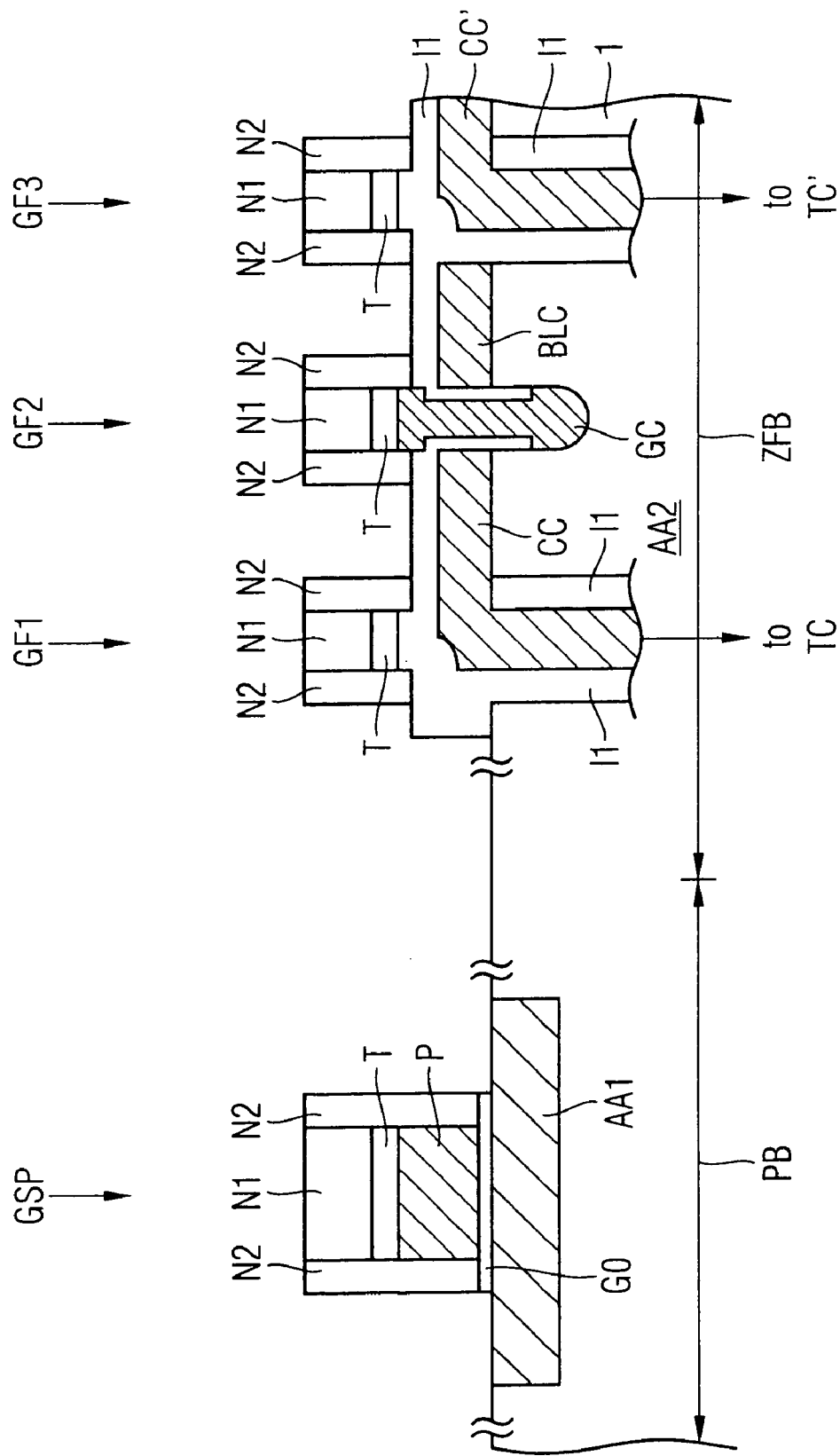

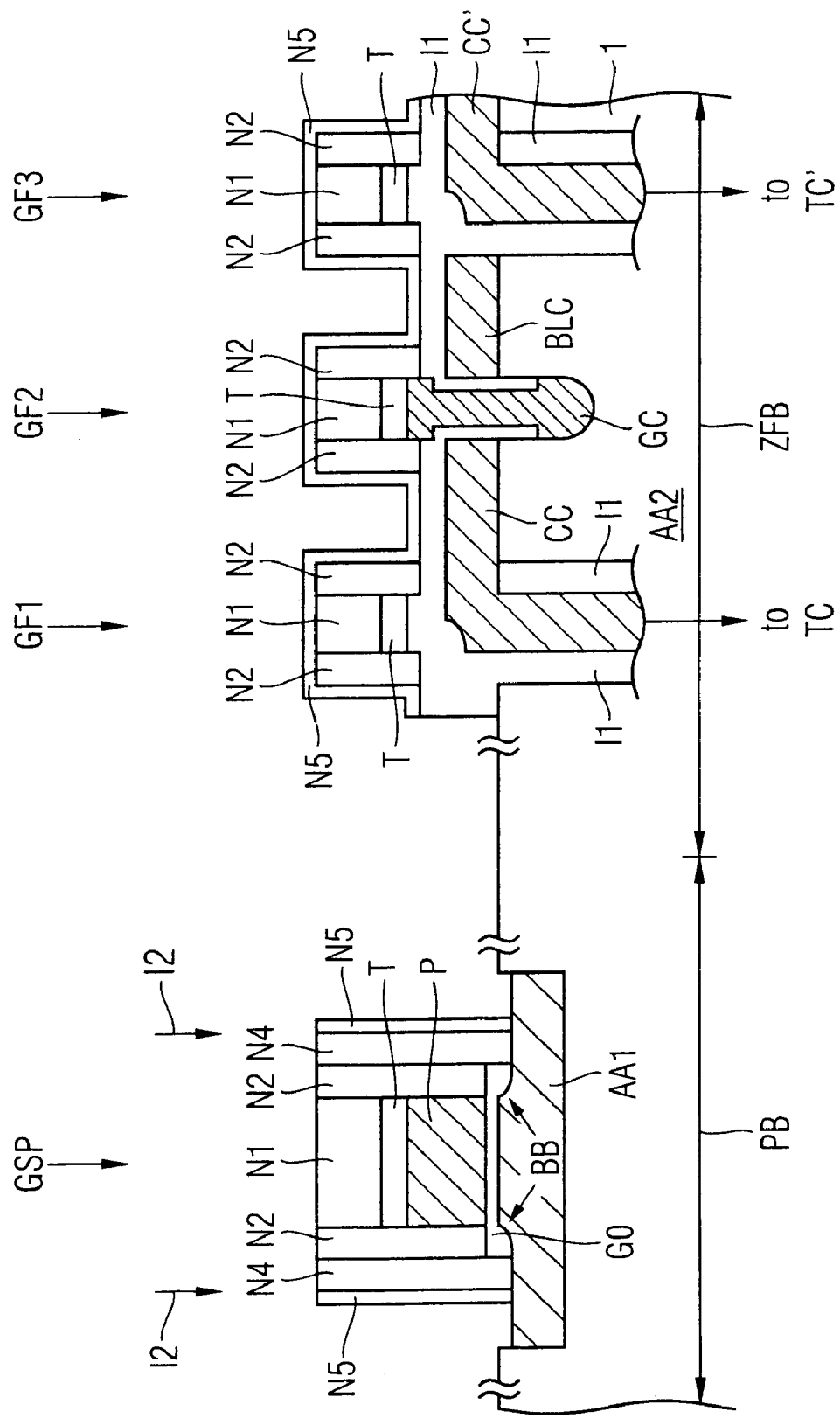

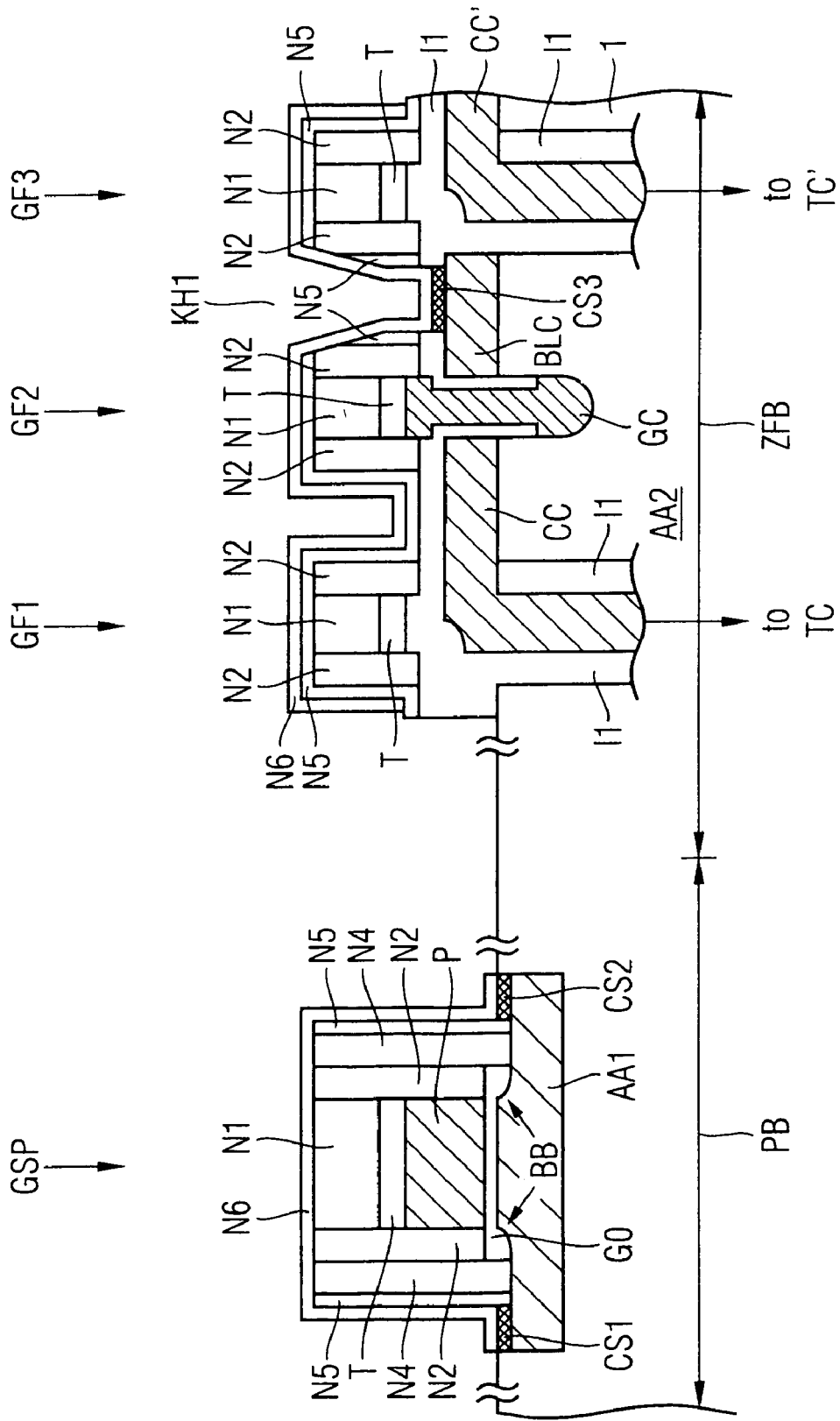

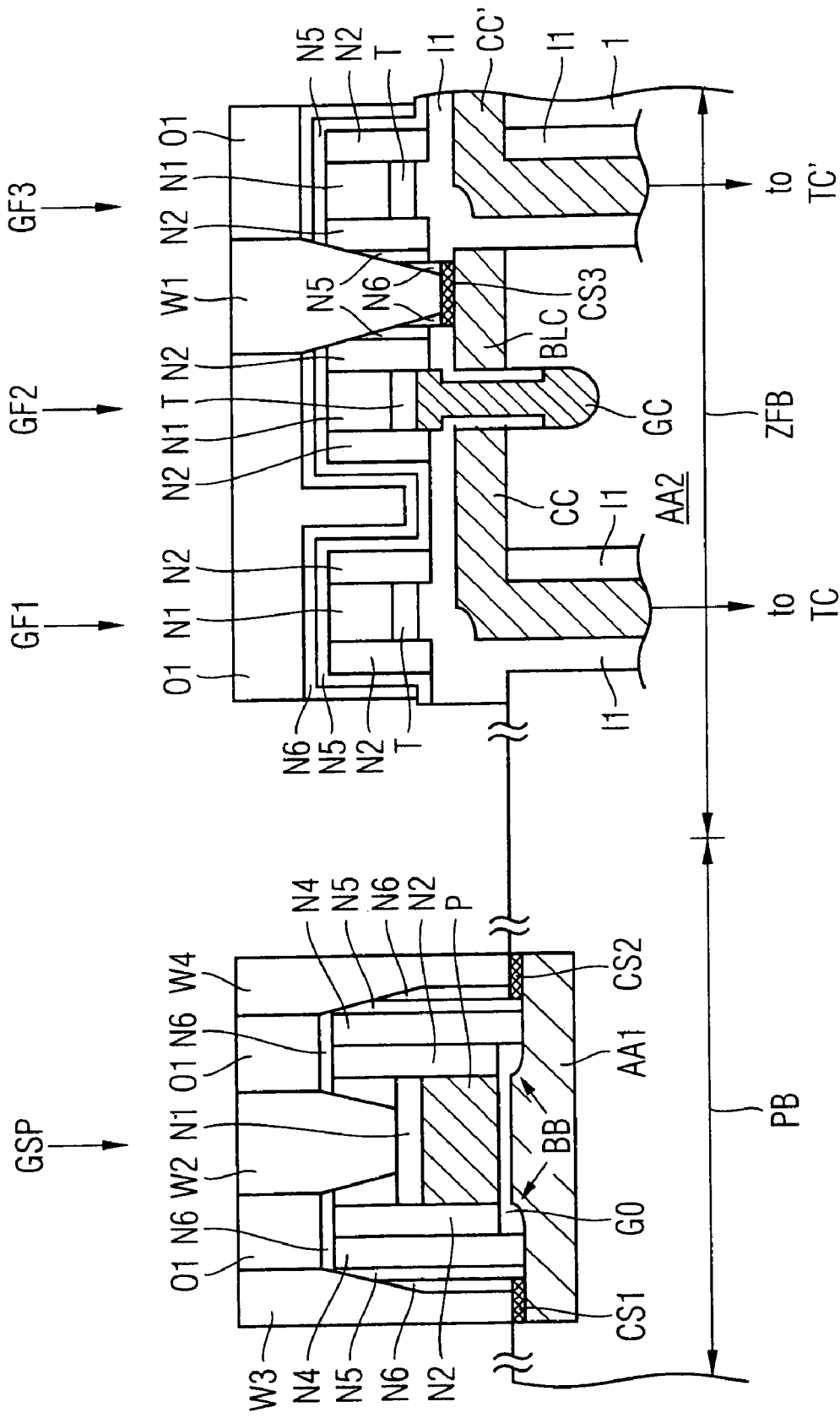

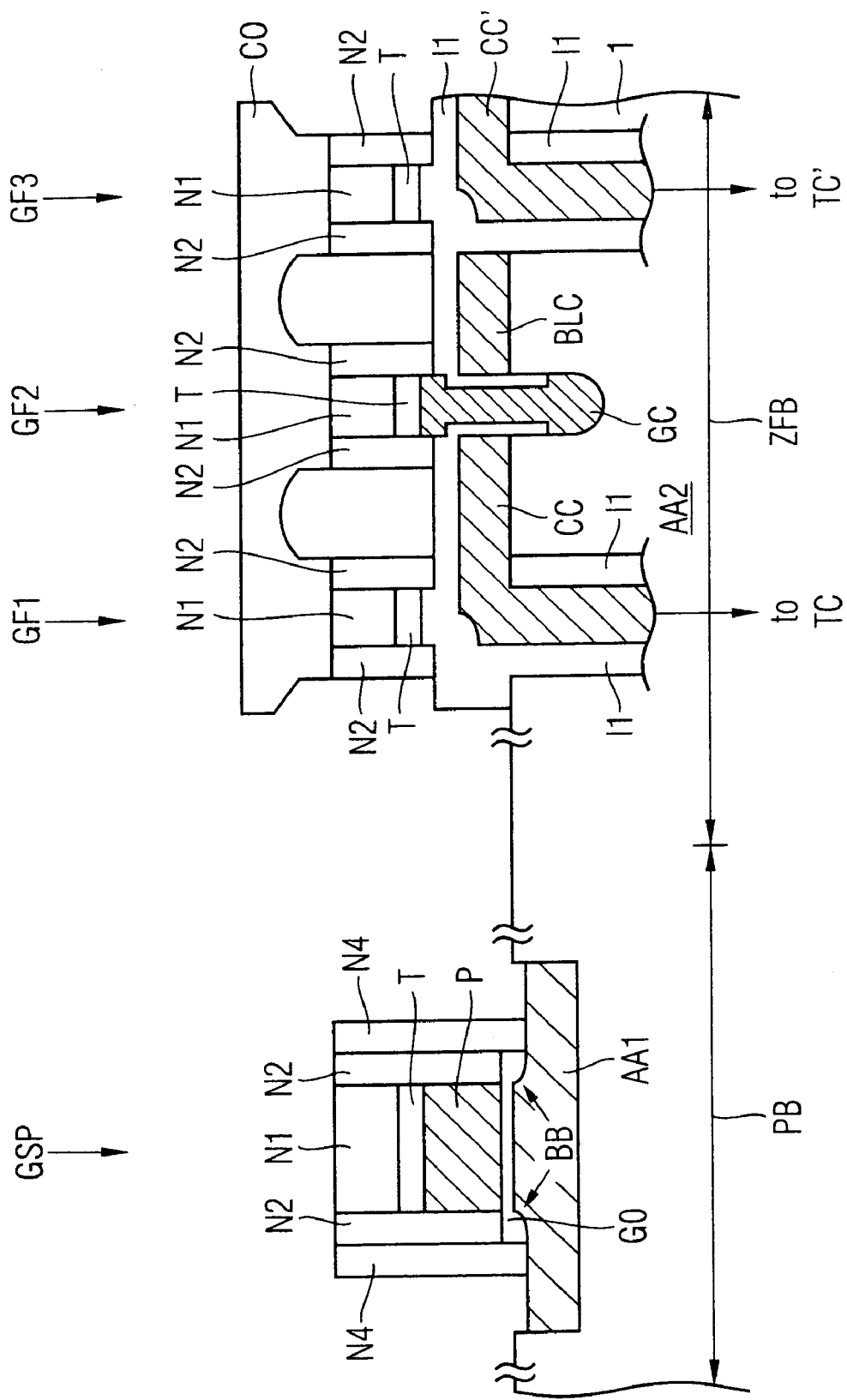

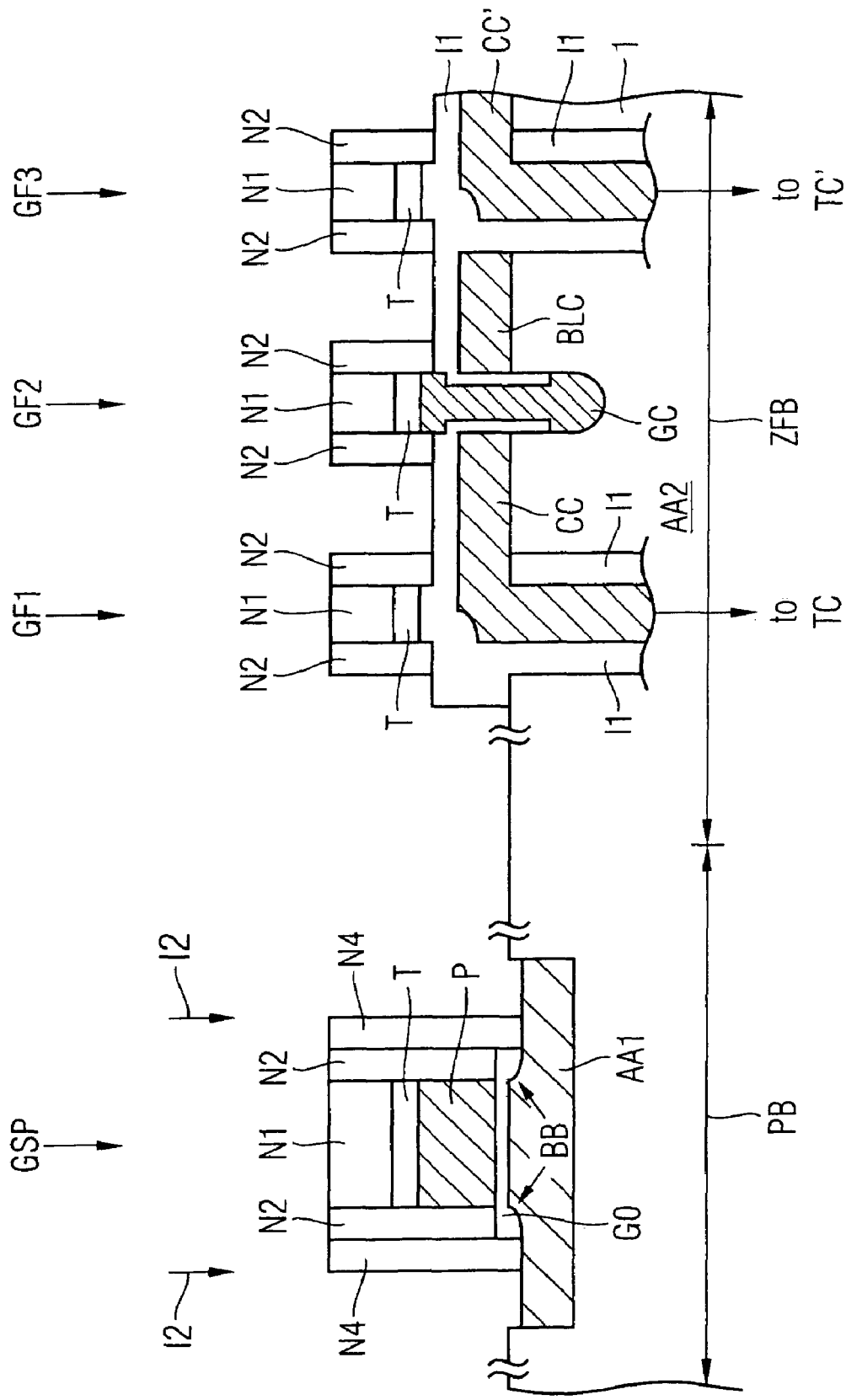

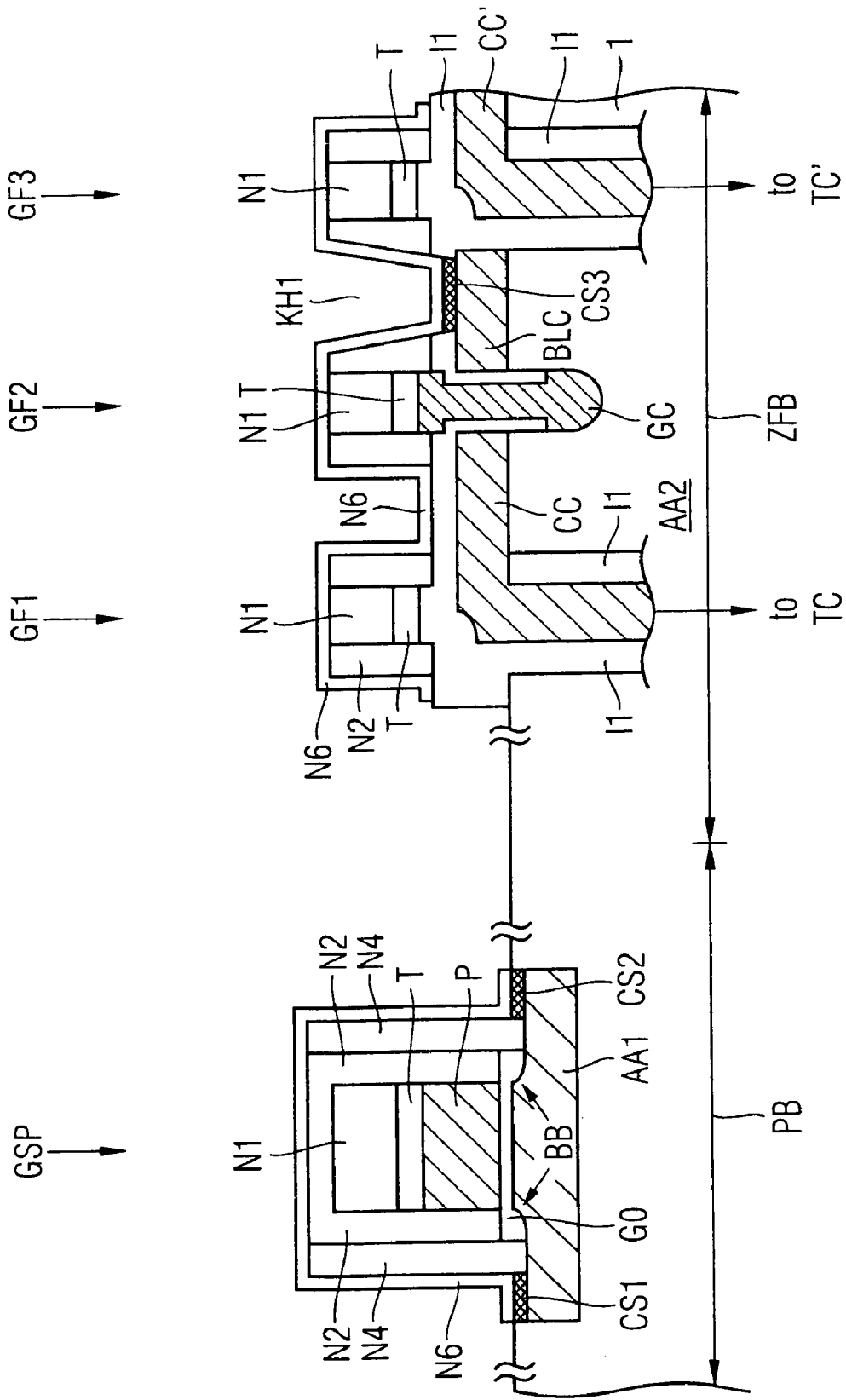

MANUFACTURING METHOD FOR AN INTEGRATED SEMICONDUCTOR STRUCTURE

BACKGROUND OF THE INVENTION

1. Field of the Invention

The present invention relates to a manufacturing method for an integrated semiconductor structure.

2. Description of the Related Art

Although in principle applicable to arbitrary integrated semiconductor structures, the following invention and the underlying problems will be explained with respect to integrated DRAM memory circuits in silicon technology.

In modern DRAM memory circuits, it is an ongoing demand to process electronic devices in a memory cell region and electronic devices in a peripheral device region as effectively as possible. Since the electronic devices of both regions require different processing, it is not always possible to process them simultaneously.

It is generally known to provide gate stacks which are covered with insulating caps surrounding the electrical conductive gate conductors, which caps comprise a plurality of isolation layers. Hereinafter, the expression cap is used to define one or more insulation layers surrounding the electrical conductive gate conductors which may be present on top of and/or surrounding the electrical conductive gate conductors.

BRIEF SUMMARY OF THE INVENTION

According to a first aspect of the invention as claimed in claim 1, a manufacturing method for an integrated semiconductor structure comprises the steps of: providing a semiconductor substrate having a plurality of gate stacks in a memory cell region and at least one gate stack in a peripheral device region; forming caps made of one or more layers of a cap material over said plurality of gate stacks in said memory cell region and over said at least one gate stack in said peripheral device region; depositing a first protective layer made of carbon or made of a carbon containing material over said memory cell region and peripheral device region; forming a mask layer on said first protective layer in said memory cell region; exposing said cap of said at least one gate stack in said peripheral device region by removing said first protective layer in said peripheral device region in an etch step wherein said mask layer acts as a mask in said memory cell region; removing said mask layer and said first protective layer from said memory cell region; forming a first contact hole between two neighboring gate stacks in said memory cell region, said first contact hole exposing a contact area; forming at least one another contact hole in said peripheral device region, said at least one another contact hole exposing another contact area which is located either adjacent to said gate stack or in said gate stack in said peripheral device region; and filling said contact hole and said at least one other contact hole with a respective contact plug.

According to a second aspect of the invention as claimed in claim 9, a manufacturing method for an integrated semiconductor structure comprises the steps of: providing a semiconductor substrate having a plurality of gate stacks in a memory cell region and at least one gate stack in a peripheral device region; forming caps made of one or more layers of a cap material over said plurality of gate stacks in said memory cell region and over said at least one gate stack in said peripheral device region; depositing a first protective layer made of carbon or made of a carbon containing material over said memory cell region and peripheral device region; forming a mask layer on said first protective layer in said memory cell region; exposing said cap of said at least one gate stack in said peripheral device region; modifying said cap of said at least one gate stack in said peripheral device region; removing said mask layer and said first protective layer from said memory cell region; forming a first contact hole between two neighboring gate stacks in said memory cell region, said first contact hole exposing a contact area; forming at least one another contact hole in said peripheral device region, said at least one other contact hole exposing other contact area which is located either adjacent to said gate stack or in said gate stack in said peripheral device region.

The invention provides a robust process flow which has an excellent process window and can be combined with stress liner concepts to process electronic devices in a memory cell region and electronic devices in a peripheral device region very effectively.

Preferred embodiments are listed in the respective dependent claims.

According to a preferred embodiment, the method further comprising the steps of: forming another layer of said cap material over said exposed cap of said at least one gate stack in said peripheral device region and over said first protective layer in said memory cell region; and performing a spacer etch step on said another layer of said cap material over said exposed cap of said at least one gate stack in said peripheral device region wherein said another layer of said cap material is removed from said first protective layer in said memory cell region.

According to a further preferred embodiment, a second protective layer is formed between said caps of said plurality of gate stacks in said memory cell region and over said cap of said at least one gate stack in said peripheral device region; and wherein an etch step using a mask is performed to define the lateral dimensions of said another contact area which is located adjacent to said gate stack in said peripheral device region.

According to a further preferred embodiment, said another contact area which is located adjacent to said gate stack in said peripheral device region is formed by exposing a part of a corresponding first active area and thereafter performing a silicidation process step in said exposed part.

According to a further preferred embodiment, after the step of removing said first protective layer from said memory cell region, an additional other layer of said cap material is formed over said at least one gate stack in said peripheral device region and over said over said plurality of gate stacks in said memory cell region.

According to a further preferred embodiment, said cap comprises a first and second nitride layer.

According to a further preferred embodiment, said second protective layers is a silicon oxide layer.

According to a further preferred embodiment, the thickness of said additional cap material layer is chosen such that said at least one other contact hole exposing said another contact area which is located adjacent to said gate stack in said peripheral device region can be formed self-aligned to said contact areas in said peripheral area.

DESCRIPTION OF THE DRAWINGS

In the Figures:

FIGS. 1A-L show schematic cross-sections of a manufacturing method for an integrated semiconductor structure according to a first embodiment of the present invention; and FIGS. 2A-D show schematic cross-sections of a manufacturing method for an integrated semiconductor structure according to a second embodiment of the present invention.

In the Figures, identical reference signs denote equivalent or functionally equivalent components.

DESCRIPTION OF THE PREFERRED EMBODIMENTS

Figure 1A:
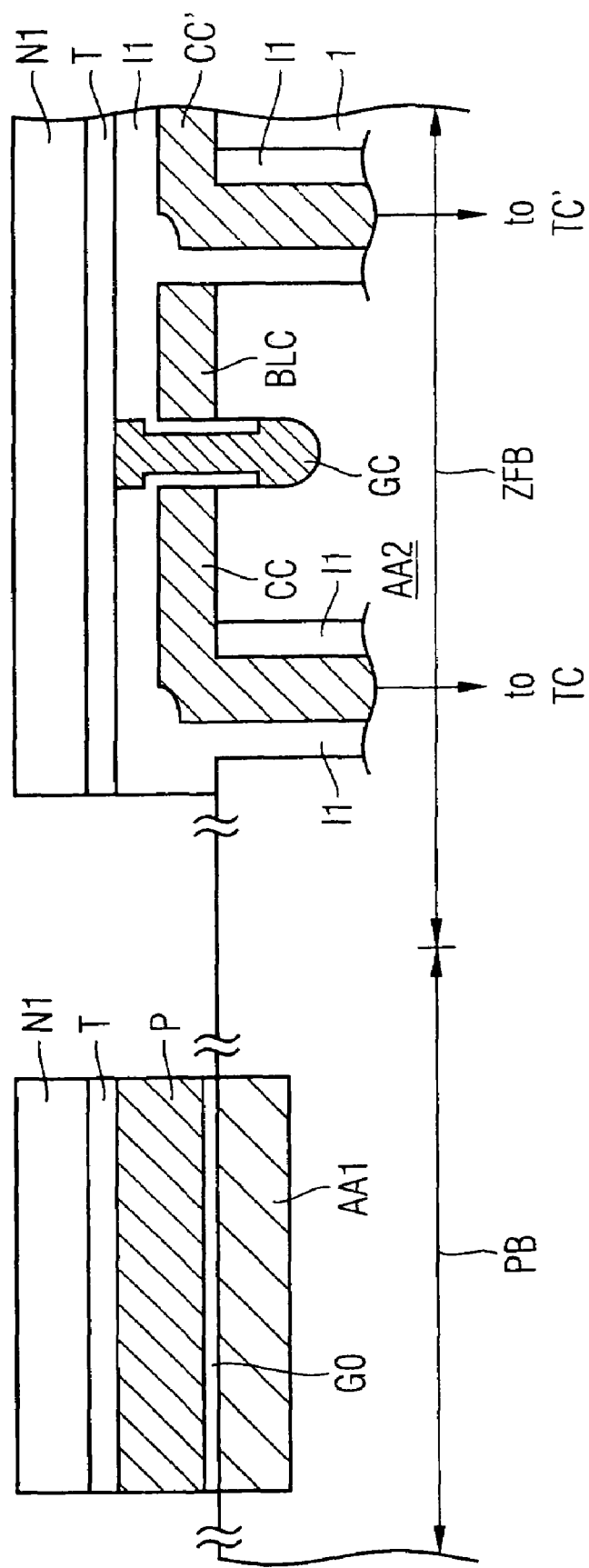

FIGS. 1A-P show schematic cross-sections of a manufacturing method for an integrated semiconductor structure according to a first embodiment of the present invention.

In FIG. 1A, reference sign 1 denotes a silicon semiconductor substrate having a peripheral device region PB and a memory cell region ZFB. In the peripheral device region PB, a first active area AA1 is provided in the substrate 1. On the main surface of the substrate 1, a thin gate dielectric layer GO is provided, for example a gate oxide layer. Although this gate dielectric layer GO is also present in the memory cell region ZFB, it is only depicted in the peripheral device region PB for the sake of clarity. Moreover, in the peripheral device region, a polysilicon layer P is provided on the gate dielectric layer GO, a tungsten layer T is provided on the polysilicon layer P, and a first nitride layer N1 is provided on the tungsten layer T.

In the active area AA2 of the memory cell region ZFB, there is an EUD transistor (EUD=extended u-groove device) having a gate conductor GC. As mentioned above, the gate dielectric layer GO underlying the gate conductor GC in the memory cell region ZFB is not shown. Moreover, reference sign CC denotes a capacitor connection line which connects the drain side of the EUD transistor to a trench capacitor TC which is buried in the substrate 1 and also not shown here.

On the source side of the EUD transistor there is a bitline connection line BLC. All of the capacitor connection line CC, the bitline connection line BLC and the gate conductor GC are made of polysilicon. They are electrically insulated by a first insulation layer I1 made of silicon oxide and party in electrical contact with the substrate 1. The tungsten layer T which is present both in the peripheral device region PB and the memory cell region ZFB lies in the latter region on the first insulation layer I1 and contacts the gate conductor GC from above. As in the peripheral device region PB, also in the memory cell region ZFB the first nitride layer N1 is on top of the tungsten layer T.

Reference sign CC' in FIG. 1A denotes another capacitor connection line which belongs to a neighboring EUD transistor which is not shown in FIGS. 1A-P and which connects the drain side of the neighboring EUD transistor to a trench capacitor TC' which is buried in the substrate 1 and also not shown here.

In a first process step which starts at the process status shown in FIG. 1A, respective gate stacks GSB, GF1, GF2, GF3 are formed in the peripheral device region PB and in the memory cell region ZFB by a lithography process step and by a subsequent etch step.

In the peripheral device region PB, a gate stack GSP of a peripheral transistor is formed by structuring the first nitride layer N1, the tungsten layer T and the polysilicon layer P. In the memory cell region ZFB, a first, second and third gate stack GF1, GF2, GF3 are formed by structuring the first nitride layer N1 and the tungsten layer T. Gate stack GF2 belongs to the EUD transistor shown in the cross-sections of FIGS. 1A-P, whereas gate stacks GF1 and GF3 belong to EUD transistors located in other cross-sections. Gate stacks GF1, GF2, GF3 are formed in the same process step as gate stack GSP. Thus, in the memory cell region ZFB, a slight overetch into the first insulation layer I1 made of silicon oxide may be advantageously obtained. This process state is shown in FIG. 1B.

In a subsequent process step which is shown in FIG. 1C, a second nitride layer N2 is deposited over the peripheral device region PB and the memory cell region ZFB and thereafter subjected to a nitride spacer etch step in order to form nitride spacers N2 surrounding said gate stacks GSP, GF1, GF2, GF3. In this process step, also the part of the gate oxide layer GO which surrounds the gate stack GSP is removed. The purpose of the nitride spacer N2 is to define an implant region in the active area AA1.

Figure 1D:
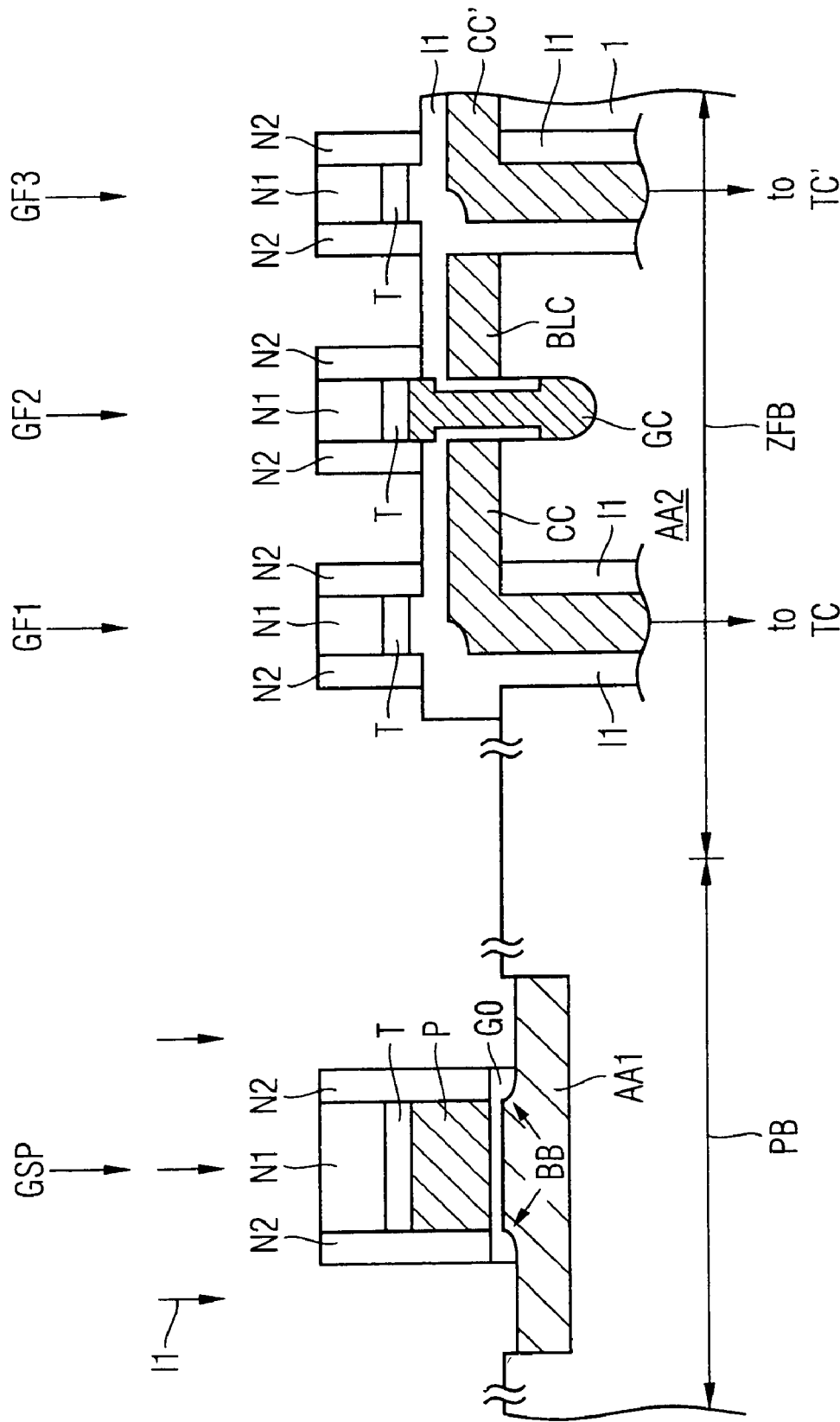

Thereafter, as shown in FIG. 1D, an oxidation step is performed optionally in order to oxidize a part of the silicon of the first active area AA1 surrounding said gate stack GSP so as to form bird's beak regions BB under gate stack GSP. Thereafter, the oxide surrounding gate stack GSP is removed in an oxide etch step using said nitride spacer N2 as a mask in order to expose the upper surface of the first active area AA1 surrounding said gate stack GSP.

Then, an ion implantation step is performed in order to introduce impurities into the first active area AA1. During this ion implantation step, the nitride spacer N2 defines the separation between the implantation area and the channel of said peripheral device.

Figure 1E:
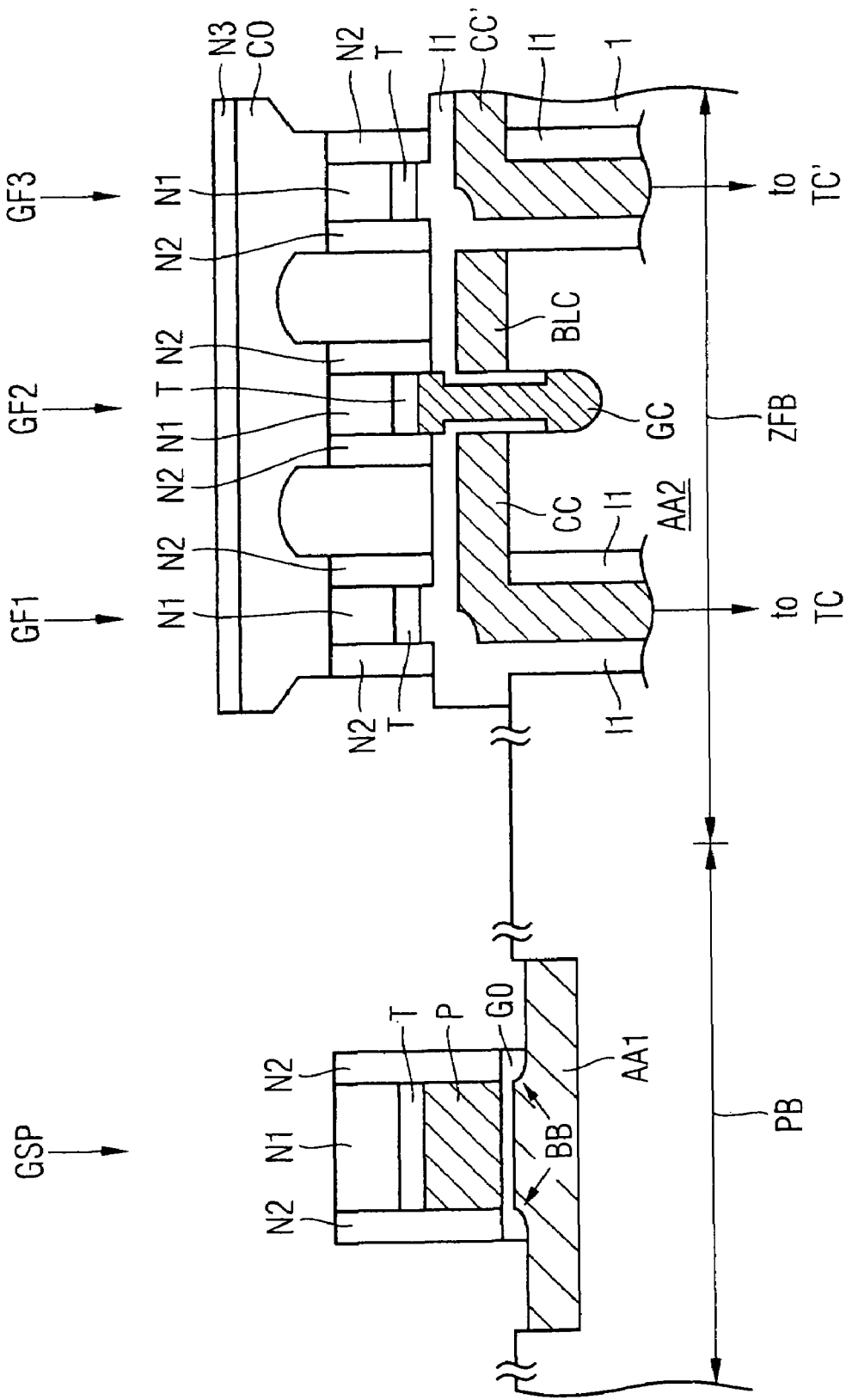

As depicted in FIG. 1E, an overfilling carbon layer CO is deposited over the structure of FIG. 1D and etched back in the peripheral device region PB by a double liner/block lithography technique.

In particular, after the deposition of the overfilling carbon layer CO, a resist planarization step is performed. The double liner consists of, e.g., first a nitride liner N3 and thereafter an amorphous silicon liner (not shown). Then, a (also not shown) photoresist blockmask is formed on the memory cell region ZFB. In a first etch step, the amorphous silicon liner is removed in the peripheral device region PB, whereafter the photoresist blockmask is stripped. In a second etch step, the nitride liner is removed in the peripheral device region PB using the amorphous silicon liner as a mask in the memory cell region ZFB. Thereafter, the amorphous silicon liner is stripped in the memory cell region ZFB. Finally, the carbon layer is removed in a third etch step in the peripheral device region PB, wherein the nitride liner N3 serves as a mask in the memory cell region ZFB. This leads to the process state shown in FIG. 1E. Accordingly, the double liner technique leaves a third nitride layer N3 over the non-conformally deposited carbon layer CO in the memory cell region ZFB.

It should be mentioned that although in this embodiment the carbon layer CO is deposited non-conformally, it is also possible to deposit a voidless conformal carbon layer by a pyrolytic or chemical vapor deposition carbon process. Also, different double liner combinations may be used, such as amorphous silicon/silicon oxide or silicon nitride/silicon oxide. Furthermore, the planarization step may be omitted. Namely, after opening the two liners in the peripheral device region, an anisotropic partial carbon etch may be performed in the peripheral device region PB only. Then the two liners may be removed in the memory cell region ZFB as well. Finally, an anisotropic carbon etch may be performed in the peripheral device region PB and in the memory cell region ZFB which will be stopped after exposure of the peripheral device region PB, leaving a residual carbon layer CO on the memory cell region ZFB.

Figure 1F:
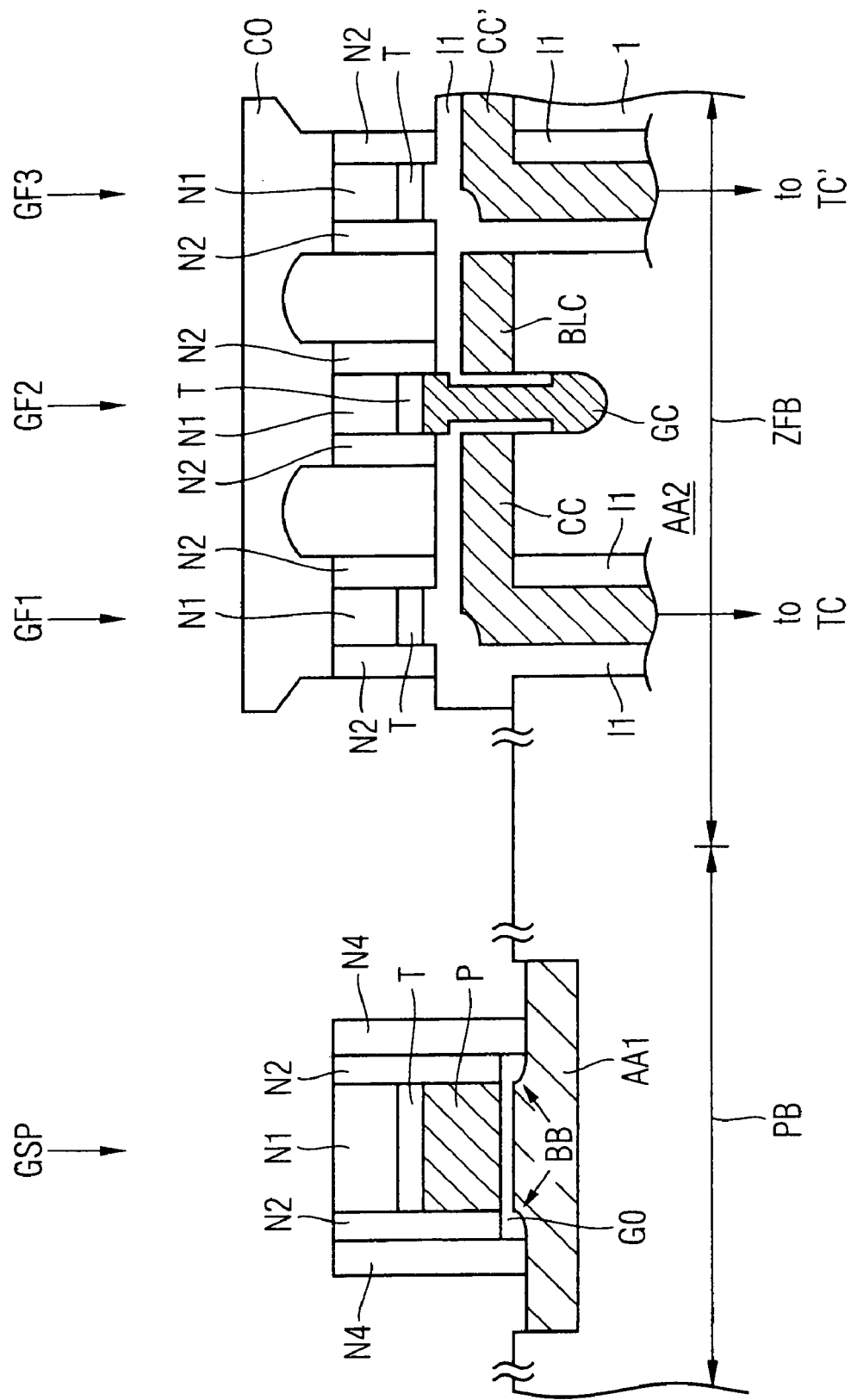

Further, with regard to FIG. 1F, another nitride layer N4 is deposited over the entire structure of FIG. 1E and etched back by a nitride spacer etch step which also removes the third nitride layer N3 on the carbon layer CO in the memory cell region ZFB.

In the next process step which is depicted in FIG. 1G, the carbon layer CO is stripped in the memory cell region ZFB in an $O_2$ plasma etch step. Thereafter, an ion implantation I2 is performed into the first active area AA1. Then, a fifth nitride layer N5 is deposited over the entire structure which serves as a silicidation protection layer in the peripheral region PB and the cell region ZFB. Thereafter, the memory cell region ZFB and not shown parts of the peripheral device region PB are masked by a mask which is not shown here, whereafter an anisotropic or wet nitride etch step is performed for removing the fifth nitride layer N5 from the contact areas of the first active region AA1 in the peripheral device region PB leaving only certain parts (not shown) of the peripheral region PB covered in order to protect them from being silicided later on. Then, the remaining parts of the not shown mask are removed.

Figure 1H:
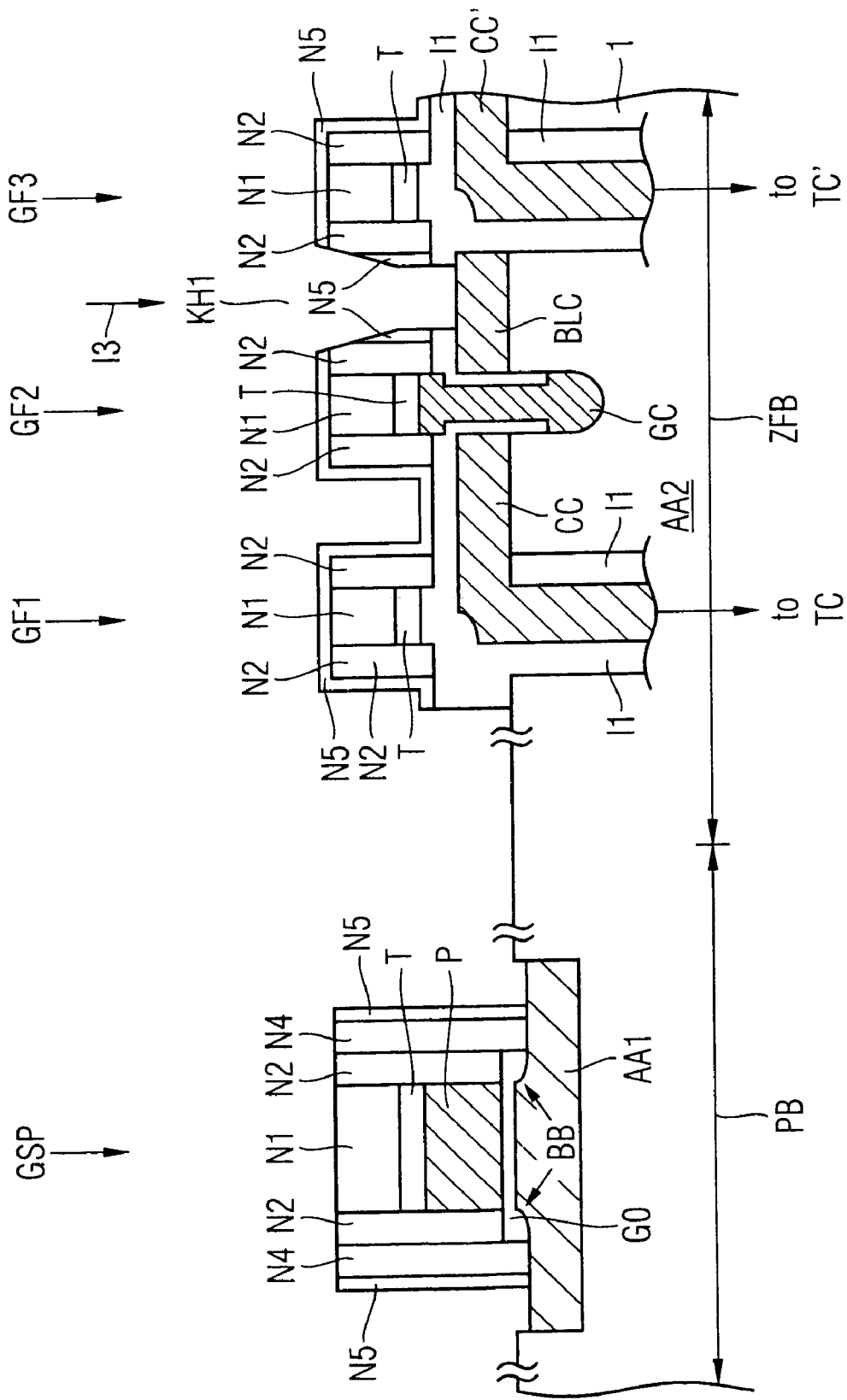

As illustrated in FIG. 1H, a first contact hole KH1 is formed in a photomask lithography step followed by an etch step which breaks through the fifth nitride layer N5 and the first isolation layer I1 between the second and third gate stack GF2, GF3 in the memory cell region ZFB. Thus, the bitline connection line BLC is exposed in the first contact hole KH1. In a subsequent ion implantation step I3, the bitline connection line BLC is doped in order to reduce the contact resistance. Thereafter, the (not shown) photomask is removed.

As shown in FIG. 1I, silicide (e.g., cobalt silicide) contact regions CS1, CS2 and CS3 are formed in the exposed regions of the first active area AA1 and in the exposed region of the bitline connection line BLC. Thereafter, a sixth thin nitride layer N6 is deposited in order to partly compensate the erosion of the fourth and fifth nitride layers N4, N5 in the cell region ZFB which took place in the foregoing process steps. Additionally, the nitride layer N6 serves as a diffusion barrier.

Figure 1J:
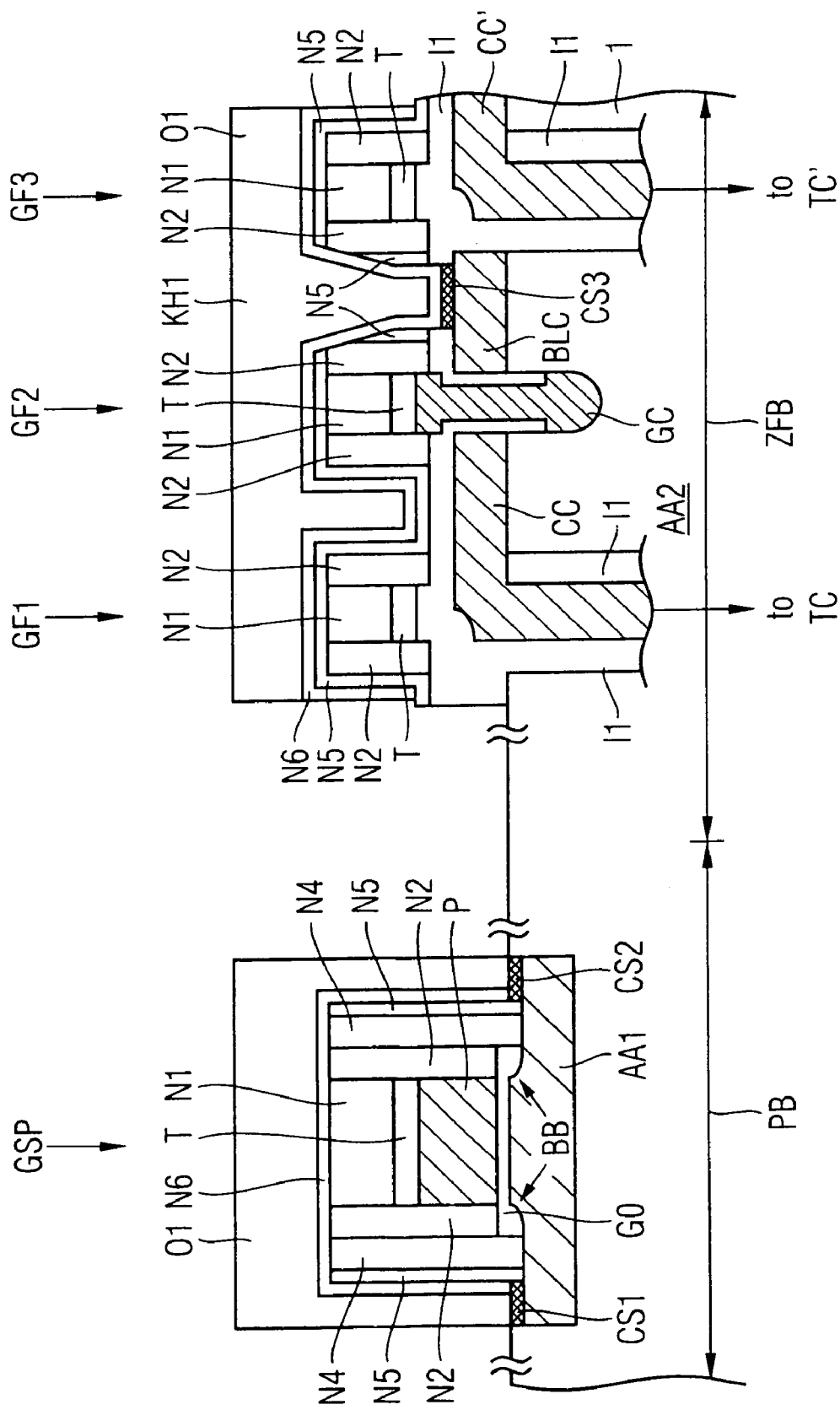

Further, with regard to FIG. 1J, a first oxide layer O1 is deposited over the entire structure and polished back by a chemical-mechanical polishing process. This first oxide layer O1 also fills the first contact hole KH1 in the memory cell region ZFB.

Figure 1K:
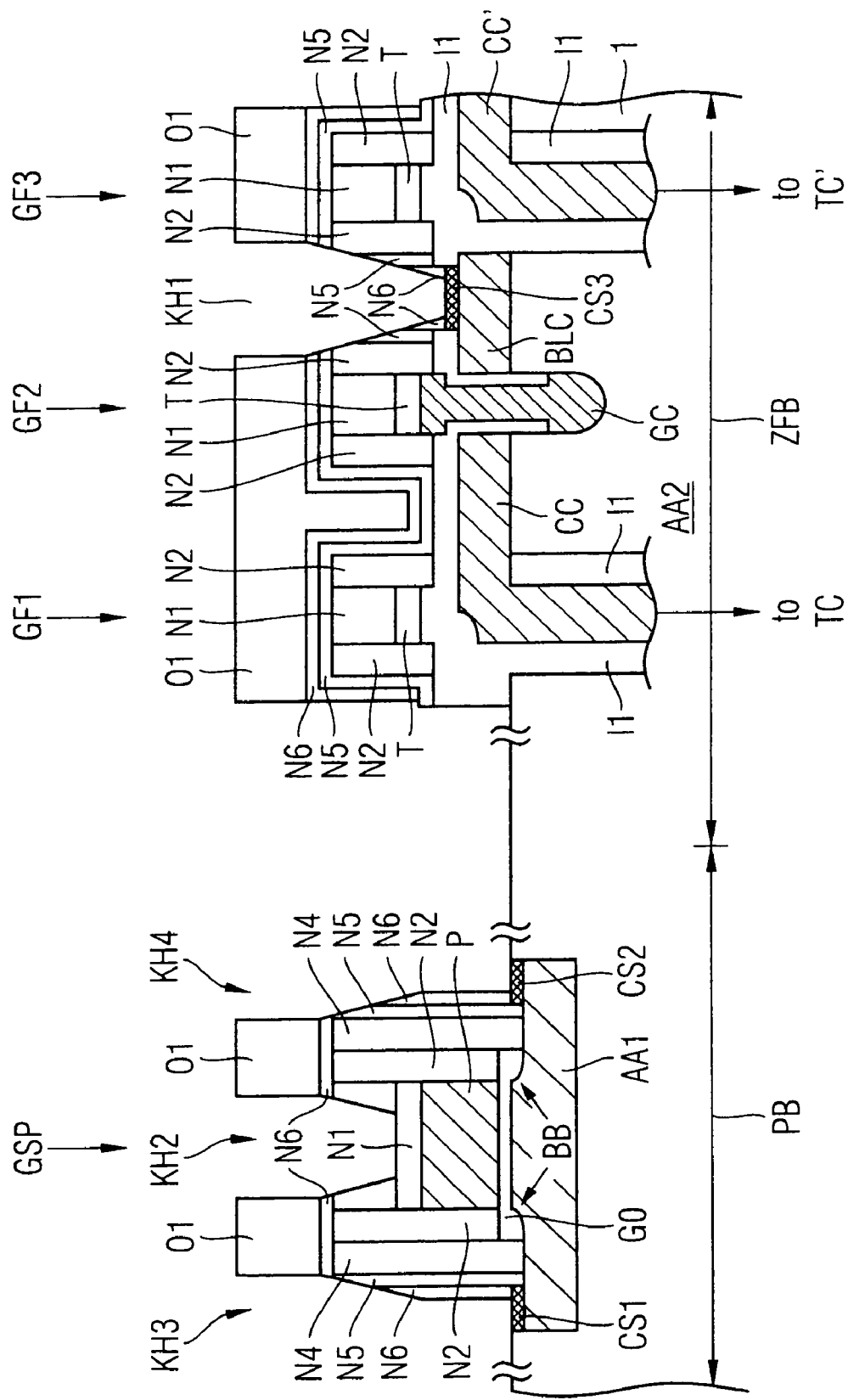

With reference to FIG. 1K, a (not shown) hardmask is formed on the entire structure and structured such that contact hole KH1 can be re-opened and the silicide contact area CS3 can be exposed. Then, the (not shown) hardmask is removed, and another lithography step using a (not shown) photo- or hardmask is performed in order to form contact holes KH2, KH3, KH4 in the peripheral device region PB. Although shown as being located in one cross-section, contact holes KH3 and KH4 are in praxis normally located in the cross-section of FIG. 1K, whereas contact hole KH2 is located in another cross-section. Contact hole KH2 exposes the tungsten region of gate stack GSP, whereas contact holes KH3 and KH4 expose silicide contact areas CS1 and CS2, respectively. Contact hole KH2 is for providing a gate contact area C4, contact hole KH3 for providing a source contact in silicide contact area CS1, and contact hole KH4 for providing a drain contact in silicide contact area CS2 of the shown transistor of the peripheral device region PB. Contact hole KH1 in the memory cell region ZFB is used for providing a bitline contact. After contact holes KH2, KH3, KH4 have been formed, the (not shown) corresponding mask is removed.

Finally, as shown in FIG. 1L, contact holes KH1, KH2, KH3, KH4 are filled with tungsten, thereafter the tungsten is polished back by a chemical-mechanical polishing step which leads to the structure of FIG. 1P where contact plugs W1, W2, W3, W4 are formed in former contact holes KH1, KH2, KH3, KH4, respectively.

The first embodiment has the advantages that a diffusion barrier liner can be easily implemented. All spacer thicknesses both in the peripheral device region and in the memory cell region are defined only by deposition processes. The spacer for the source/drain regions in the peripheral device region is completely formed from nitride for self-aligned contact etch. There is no overfill which would be depending on necessary spacer thickness, and no complete wet strip in array is necessary.

FIGS. 2A-D show schematic cross-sections of a manufacturing method for an integrated semiconductor structure according to a second embodiment of the present invention.

The process flow of the second embodiment starts at the process state of FIG. 2A which corresponds to the process state of FIG. 1F explained above.

As depicted in FIG. 2B, the carbon layer CO is removed in an $O_2$ plasma etch step. Thereafter, an ion implantation I2 is performed into the first active area AA1. Then, a not shown thin oxide liner is deposited as silicidation blocking layer over the entire structure whereafter a lithography step is performed for protecting (not shown) only certain parts of the peripheral device region. Then, the thin oxide liner is removed in a wet etch step, and the photoresist is also removed again.

Figure 2C:
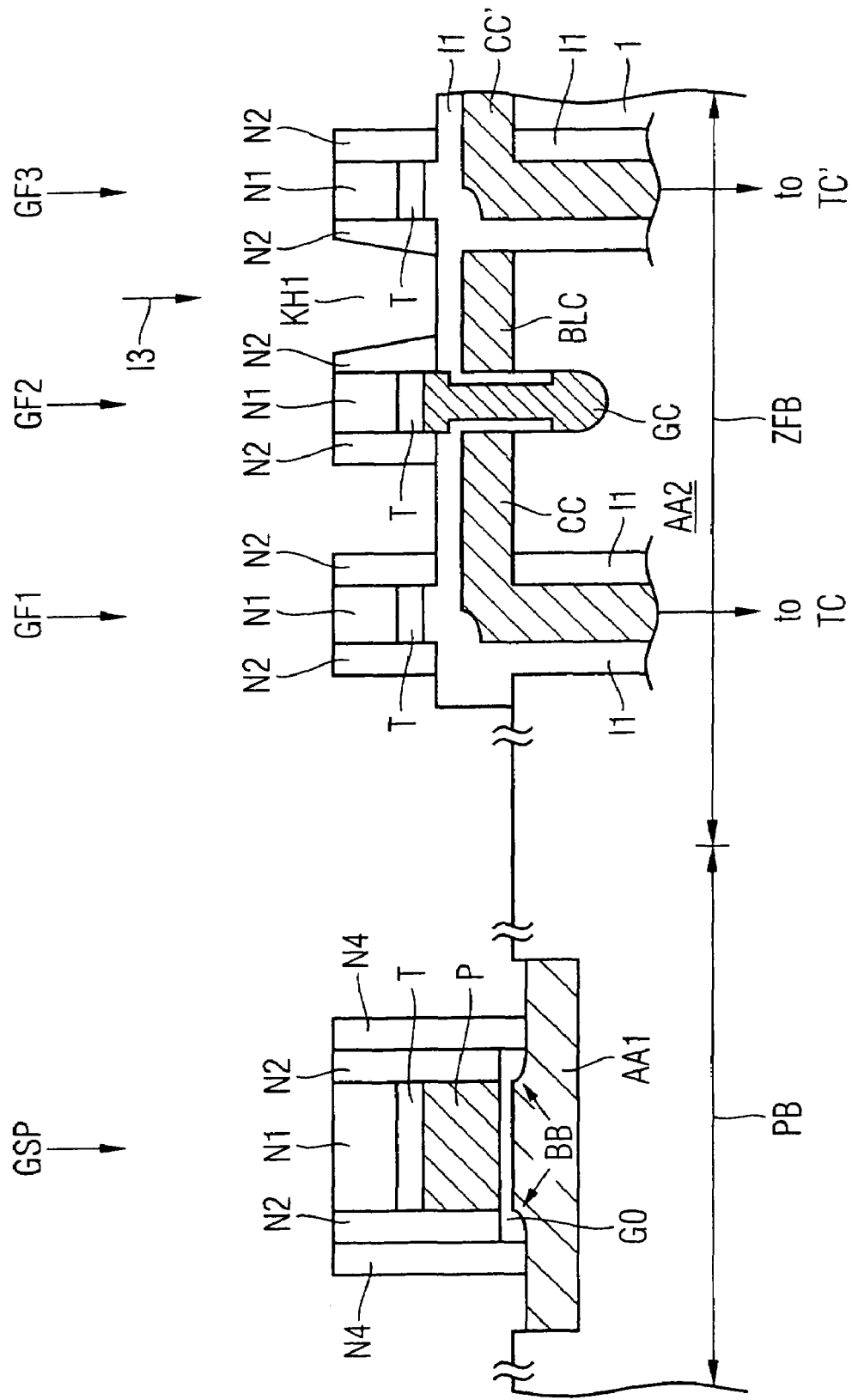

As depicted in FIG. 2C, a (not shown) photomask is formed on the structure and a first contact hole KH1 is formed between gate stacks GF2, GF3 in the memory cell region ZFB. The contact hole KH1 exposes the upper surface of bitline connection line BLC. Thereafter, an ion implantation I3 is performed for adjusting the contact resistance in the exposed bitline connection line BLC and in the exposed areas of the first active area AA1. Then, the photomask is stripped.

As illustrated in FIG. 2D, silicide (e.g., cobalt silicide) contact regions CS1, CS2 and CS3 are formed on the exposed regions of the first active area AA1 and on the exposed area of the bitline connection line BLC. Then, a nitride liner layer N6 is deposited over the entire structure.

The further process steps after the process state of FIG. 2D are identical to the process steps which have been explained above with respect to FIGS. 1J to 1L, and therefore a repeated description thereof is omitted.

Although the present invention has been described with reference to a preferred embodiment, it is not limited thereto, but can be modified in various manners which are obvious for a person skilled in the art. Thus, it is intended that the present invention is only limited by the scope of the claims attached herewith.

The invention claimed is:

1. A manufacturing method for an integrated semiconductor structure comprising the steps of:
   providing a semiconductor substrate having a plurality of gate stacks in a memory cell region and at least one gate stack in a peripheral device region;
   forming caps made of one or more layers of a cap material over said plurality of gate stacks in said memory cell region and over said at least one gate stack in said peripheral device region;
   depositing a first protective layer made of carbon or made of a carbon containing material over said memory cell region and peripheral device region;
   forming a mask layer on said first protective layer in said memory cell region;
   exposing said cap of said at least one gate stack in said peripheral device region by removing said first protective layer in said peripheral device region in an etch step wherein said mask layer acts as a mask in said memory cell region;

removing said mask layer and said first protective layer from said memory cell region;

forming a first contact hole between two neighboring gate stacks in said memory cell region, said first contact hole exposing a contact area;

forming at least one other contact hole in said peripheral device region, said at least one another contact hole exposing other contact area which is located either adjacent to said gate stack or in said gate stack in said peripheral device region; and filling said contact hole and said at least one other contact hole with a respective contact plug.

2. The method according to claim 1, further comprising the steps of:

forming another layer of said cap material over said exposed cap of said at least one gate stack in said peripheral device region and over said first protective layer in said memory cell region; and performing a spacer etch step on said another layer of said cap material over said exposed cap of said at least one gate stack in said peripheral device region wherein said another layer of said cap material is removed together with said mask layer from said first protective layer in said memory cell region.

3. The method according to claim 1, wherein a second protective layer is formed between said caps of said plurality of gate stacks in said memory cell region and over said cap of said at least one gate stack in said peripheral device region; and wherein an etch step using a mask is performed to define the lateral dimensions of said another contact area which is located adjacent to said gate stack in said peripheral device region.

4. The method according to claim 1, wherein said another contact area which is located adjacent to said gate stack in said peripheral device region is formed by exposing a part of a corresponding first active area and thereafter performing a silicidation process step in said exposed part.

5. The method according to claim 1, wherein after the step of removing said first protective layer from said memory cell region, a still another layer of said cap material is formed over said at least one gate stack in said peripheral device region and over said over said plurality of gate stacks in said memory cell region.

6. The method according to claim 1, wherein said cap comprises a first and second nitride layer.

7. The method according to claim 3, wherein said second protective layer is a silicon oxide layer.

8. The method according to claim 5, wherein the thickness of said still another cap material layer is chosen such that said at least one other contact hole exposing said other contact area which is located adjacent to said gate stack in said peripheral device region can be formed in a self-aligned manner.

9. A manufacturing method for an integrated semiconductor structure comprising the steps of:

providing a semiconductor substrate having a plurality of gate stacks in a memory cell region and at least one gate stack in a peripheral device region;

forming caps made of one or more layers of a cap material over said plurality of gate stacks in said memory cell region and over said at least one gate stack in said peripheral device region;

depositing a first protective layer made of carbon or made of a carbon containing material over said memory cell region and peripheral device region;

forming a mask layer on said first protective layer in said memory cell region;

exposing said cap of said at least one gate stack in said peripheral device region;

modifying said cap of said at least one gate stack in said peripheral device region;

removing said mask layer and said first protective layer from said memory cell region;

forming a first contact hole between two neighboring gate stacks in said memory cell region, said first contact hole exposing a contact area;

forming at least one other contact hole in said peripheral device region, said at least one other contact hole exposing another contact area which is located either adjacent to said gate stack or in said gate stack in said peripheral device region.

10. The method according to claim 9, further comprising the step of filling said contact hole and said at least one another contact hole with a respective contact plug.

11. The method according to claim 9, further comprising the steps of:

forming another layer of said cap material over said exposed cap of said at least one gate stack in said peripheral device region and over said first protective layer in said memory cell region; and performing a spacer etch step on said another layer of said cap material over said exposed cap of said at least one gate stack in said peripheral device region wherein said another layer of said cap material is removed from said first protective layer in said memory cell region.

12. The method according to claim 9, wherein a second protective layer is formed between said caps of said plurality of gate stacks in said memory cell region and over said cap of said at least one gate stack in said peripheral device region; and wherein an etch step using a mask is performed to define the lateral dimensions of said another contact area which is located adjacent to said gate stack in said peripheral device region.

13. The method according to claim 9, wherein said another contact area which is located adjacent to said gate stack in said peripheral device region is formed by exposing a part of a corresponding first active area and thereafter performing a silicidation process step in said exposed part.

14. The method according to claim 9, wherein after the step of removing said first protective layer from said memory cell region, a still another layer of said cap material is formed over said at least one gate stack in said peripheral device region and over said plurality of gate stacks in said memory cell region.

15. The method according to claim 9, wherein said cap comprises a first and second nitride layer.

16. The method according to claim 12, wherein said second protective layers is a silicon oxide layer.

17. The method according to claim 14, wherein the thickness of said still another cap material layer is chosen such that said at least one another contact hole exposing said another contact area which is located adjacent to said gate stack in said peripheral device region can be formed in a self-aligned manner.

* * * * *